United States Patent
Hayashida et al.

(10) Patent No.: US 9,590,179 B2
(45) Date of Patent: Mar. 7, 2017

(54) CURABLE COMPOSITION, CURED PRODUCT, AND ORGANIC ELECTROLUMINESCENT ELEMENT USING SAME

(75) Inventors: Hiroyuki Hayashida, Kitakyushu (JP); Masashi Niina, Kitakyushu (JP); Hiroshige Tanaka, Kitakyushu (JP); Kazuto Shiraishi, Kitakyushu (JP); Tohru Asari, Kitakyushu (JP); Kazuaki Yoshimura, Kitakyushu (JP)

(73) Assignee: NIPPON STEEL & SUMIKIN CHEMICAL CO., LTD., Tokyo (JP)

( * ) Notice: Subject to any disclaimer, the term of this patent is extended or adjusted under 35 U.S.C. 154(b) by 770 days.

(21) Appl. No.: 14/005,806

(22) PCT Filed: Jan. 19, 2012

(86) PCT No.: PCT/JP2012/051060
§ 371 (c)(1),
(2), (4) Date: Sep. 17, 2013

(87) PCT Pub. No.: WO2012/132501
PCT Pub. Date: Oct. 4, 2012

(65) Prior Publication Data
US 2014/0008626 A1    Jan. 9, 2014

(30) Foreign Application Priority Data

Mar. 28, 2011    (JP) .................................. 2011-070209

(51) Int. Cl.
| | | |
|---|---|---|
| H01L 51/00 | (2006.01) | |
| C08F 12/26 | (2006.01) | |
| C08F 12/32 | (2006.01) | |
| C08F 12/34 | (2006.01) | |
| H05B 33/20 | (2006.01) | |
| C08G 59/26 | (2006.01) | |
| C08L 63/00 | (2006.01) | |
| C09K 11/06 | (2006.01) | |
| H01L 51/50 | (2006.01) | |

(52) U.S. Cl.
CPC .......... *H01L 51/0042* (2013.01); *C08F 12/26* (2013.01); *C08F 12/32* (2013.01); *C08F 12/34* (2013.01); *C08G 59/26* (2013.01); *C08L 63/00* (2013.01); *C09K 11/06* (2013.01); *H01L 51/006* (2013.01); *H01L 51/0035* (2013.01); *H01L 51/0072* (2013.01); *H05B 33/20* (2013.01); *C09K 2211/1007* (2013.01); *C09K 2211/1011* (2013.01); *C09K 2211/1029* (2013.01); *H01L 51/5056* (2013.01)

(58) Field of Classification Search
CPC .................................................. H01L 51/0042
See application file for complete search history.

(56) References Cited

U.S. PATENT DOCUMENTS

| | | | |
|---|---|---|---|
| 5,843,607 A * | 12/1998 | Hu .................... | G03G 5/0653 |
| | | | 430/58.5 |
| 5,942,340 A | 8/1999 | Hu et al. | |
| 2004/0137271 A1 | 7/2004 | Sohn et al. | |
| 2004/0209117 A1* | 10/2004 | Aziz .................... | C07D 471/14 |
| | | | 428/690 |
| 2006/0128969 A1 | 6/2006 | Li et al. | |
| 2006/0142520 A1 | 6/2006 | Jones et al. | |
| 2012/0313513 A1 | 12/2012 | Tanaka et al. | |

FOREIGN PATENT DOCUMENTS

| | | |
|---|---|---|
| JP | 11-176578 A | 7/1999 |
| JP | 2004-51503 A | 2/2004 |
| JP | 2004-204234 A | 7/2004 |
| JP | 2008-183048 A | 7/2006 |
| JP | 2009-16739 A | 1/2009 |
| JP | 2009-252944 A | 10/2009 |
| WO | WO-2004/021463 A2 | 3/2004 |
| WO | WO-2011/105204 A1 | 9/2011 |

OTHER PUBLICATIONS

Akimoto et al., "Syntheses and Photonic Properties of Indolocarbazole Derivatives," 2009, Trans. Mater. Res. Soc. Japan 34, pp. 141-144.*
International Search Report for the Application No. PCT/JP2012/051060 mailed Apr. 17, 2012.
English Translation of International Preliminary Report on Patentability (PCT/IPEA/409) for Application No. PCT/JP2012/051060 dated Jul. 31, 2013.
Akimoto, Masaji et al., "Syntheses and Photonic Properties of Polymers Containing Indolocarbazole Moiety", 18th Polymer Materials Forum, 2009, p. 58.
Akimoto, Masaji et al., "Syntheses of novel Indolo [3,2-b] carbazole derivatives 2: Syntheses and photonic properties of polymers", The Chemical Society of Japan, 2008, 4 L7-43, p. 597.
Akimoto, Masaji et al., "Syntheses and Photonic Properties of Indolocarbazole Derivatives", Transaction of the Materials Research Society of Japan, 2009, vol. 34, No. 1, pp. 141-144.

* cited by examiner

*Primary Examiner* — Robert Vetere
(74) *Attorney, Agent, or Firm* — Cheng Law Group, PLLC

(57) ABSTRACT

Provided are a curable composition for an organic electroluminescent element, which has high light emission efficiency and is applicable to a wet process, a cured product thereof, and an organic electroluminescent element containing the cured product in an organic layer. More specifically, provided are a curable composition containing a compound represented by an indolocarbazole skeleton compound, a cured product obtained by curing the curable composition, and an organic electroluminescent element containing the cured product in an organic layer.

7 Claims, No Drawings

CURABLE COMPOSITION, CURED PRODUCT, AND ORGANIC ELECTROLUMINESCENT ELEMENT USING SAME

TECHNICAL FIELD

The present invention relates to a curable composition containing an indolocarbazole skeleton compound having two polymerizable groups, a cured product thereof, and an organic electroluminescent element using the cured product.

BACKGROUND ART

In general, an electroluminescent element includes an inorganic electroluminescent element using an inorganic compound in a light emitting element and an organic electroluminescent element using an organic compound in a light emitting element. In recent years, active studies on practical realization of the organic electroluminescent element have been made because the element can achieve light emission at a low voltage and at a high luminance.

A basic structure of the organic electroluminescent element is obtained by forming a hole injection layer and an organic thin-film layer such as a light emission layer on a glass plate deposited with a thin film of an anode material such as indium-tin oxide (ITO) and further forming a thin film of a cathode material thereon, and there is known an element obtained by appropriately providing a hole transport layer or an electron transport layer on the basic structure. A construction of layers in the organic electroluminescent element is, for example, anode/hole injection layer/light emission layer/electron transport layer/cathode or anode/hole injection layer/hole transport layer/light emission layer/electron transport layer/cathode.

In recent years, it has been found that when charge transport layers such as the hole injection layer and the hole transport layer are integrated between the light emission layer and the anode, the layer improves an ability to inject holes into the light emission layer and serves as a buffer layer that optimizes a charge balance to significantly improve light emission efficiency and life of the element.

Hole transporting materials used in the hole transport layer of the organic electroluminescent element are broadly classified into a low-molecular-weight hole transporting material and a high-molecular-weight hole transporting material.

As a method of forming the low-molecular-weight hole transporting material into a film serving as the hole transport layer, a vacuum deposition method is mainly used and has the following characteristics. According to the method, it is easy to produce a multilayer using various materials having different functions, which allows a high-performance organic electroluminescent element to be formed. However, there is a problem in that it is difficult to control a thickness uniformly and to apply different materials depending on parts for achieving a large-screen and high-definition panel, and a large-size vacuum apparatus is required, resulting in an increase in production cost.

In addition, as the method of forming the low-molecular-weight hole transporting material into a film serving as the hole transport layer, a film formation method involving application of a solution containing the low-molecular-weight hole transporting material has been studied toward practical use. However, it is necessary to improve this technique for practical use because segregation and phase separation due to crystallization of the low-molecular-weight compound are observed.

On the other hand, as a method of forming the high-molecular-weight hole transporting material into a film, a solution application method such as a spin coating method, a printing method, or an ink-jet method is used because most of the material cannot be deposited by the vacuum deposition method. The method facilitates an increase in screen size and is excellent in mass productivity. In contrast, the method involves the following problems. Layers are liable to mix with each other and hence function separation by lamination cannot be performed. In addition, properties different from those required in a dry process such as solubility in a solvent are required, and hence a charge injecting material and charge transporting material that can be used in a wet process are limited.

As attempts to express such required properties, for example, Patent Literature 1 reports an acrylic compound or a cured product thereof, and Patent Literature 2 reports a cured product using an NPD having a vinyl group. Although function separation by lamination is achieved in an organic electroluminescent element using any such compound, its electron resistance and charge transporting performance are not sufficient, and hence the element has not obtained sufficient properties.

In addition, as a technique of enhancing the light emission efficiency of the organic electroluminescent element, a polymer material having a main chain of a π-conjugated polymer including an indolocarbazole unit excellent in electron resistance and charge transporting performance integrated thereinto, and a light emitting element including the polymer material have been disclosed. That is, Patent Literature 3 discloses a conjugated polymer obtained by bonding an indolocarbazole at 6- and 12-positions, and Patent Literature 4 discloses a conjugated polymer having an N-position substituted indolocarbazole as a main skeleton. Those polymers each improve the electron resistance and the charge transporting performance. However, the π-conjugated polymer containing an indolocarbazole skeleton in its main chain involves the following problem. The polymer has low solubility in an organic solvent and hence it is difficult to form the polymer into a film. Even when the polymer can be formed into a film, the thin film itself does not have any solvent resistance as in any other polymer that can be applied, and hence any other material such as a light emission layer material cannot be formed into a film on the film by an application method after the film formation.

CITATION LIST

Patent Literature

[PTL 1] JP 2009-16739 A
[PTL 2] JP 2009-252944 A
[PTL 3] JP 2004-204234 A
[PTL 4] JP 2006-183048 A

SUMMARY OF INVENTION

The production of a high-performance organic electroluminescent element by a solution application method requires the formation of an organic thin-film layer having high electron resistance and high charge transporting performance, and insoluble in any solvent.

The present invention has been made in view of the above-mentioned problems, and an object of the present invention is to provide a curable composition containing an indolocarbazole skeleton compound having two polymerizable groups for an organic electroluminescent element, which has high light emission efficiency and is applicable to a wet process, and a cured product thereof. Another object of the present invention is to provide an organic electroluminescent element using the curable composition or the cured product, which is used in a lighting device, an image display device, a back light for a display device, and the like.

To achieve the objects, the inventors of the present invention have made extensive studies, and as a result, have found that when a curable composition containing an indolocarbazole skeleton compound having two polymerizable groups and a cured product thereof are used, an organic layer containing any other material can be laminated as an upper layer by application and light emission performance improves. Thus, the inventors have completed the present invention.

The present invention relates to a curable composition containing an indolocarbazole skeleton compound having two polymerizable groups, a cured product thereof, and an organic electroluminescent element having organic layers between an anode layer and a cathode layer laminated on a substrate, in which at least one of the organic layers contains the curable composition or the cured product.

The present invention relates to a curable composition, including 5 to 100 mol % of a compound represented by the general formula (1) and 0 to 95 mol % of a compound represented by the general formula (2) with respect to the total number of moles of the compound represented by the general formula (1) and the compound represented by the general formula (2) defined as 100.

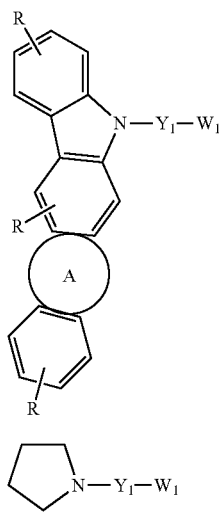

(1)

In the formula, a ring A represents a heterocycle represented by the formula (1a), the heterocycle being condensed with an adjacent ring at an arbitrary position, R's each represent a hydrogen atom, a $C_1$ to $C_{20}$ alkyl group, a $C_1$ to $C_{20}$ alkoxy group, a $C_6$ to $C_{30}$ aryl group, a $C_6$ to $C_{30}$ aryloxy group, a $C_7$ to $C_{36}$ arylalkyl group, a $C_7$ to $C_{36}$ arylalkyloxy group, a $C_3$ to $C_{30}$ heteroaryl group, a $C_3$ to $C_{30}$ heteroaryloxy group, a $C_4$ to $C_{36}$ heteroarylalkyl group, a $C_4$ to $C_{36}$ heteroarylalkyloxy group, or a $C_3$ to $C_{30}$ cycloalkyl group, and may be identical to or different from one another, $Y_1$'s each represent a single bond or a divalent group, and may be identical to or different from each other, and each represent a $C_1$ to $C_{20}$ alkylene group, a $C_6$ to $C_{30}$ arylene group, a $C_3$ to $C_{30}$ heteroarylene group, CO, COO, or O, and may be identical to or different from each other, and $W_1$'s each represent a polymerizable group and may be identical to or different from each other.

(2)

In the formula, Z represents a $C_6$ to $C_{30}$ aryl group, a $C_3$ to $C_{30}$ heteroaryl group, or a $C_{12}$ to $C_{60}$ diarylamino group, $Y_2$ represents a single bond or a divalent group, and $W_2$ represents a polymerizable group, provided that none of Z, R's, $Y_1$'s, and $Y_2$ has a condensed ring structure formed of five or more rings.

A preferred example of the compound represented by the general formula (1) is a compound represented by the following formula (3) or (4).

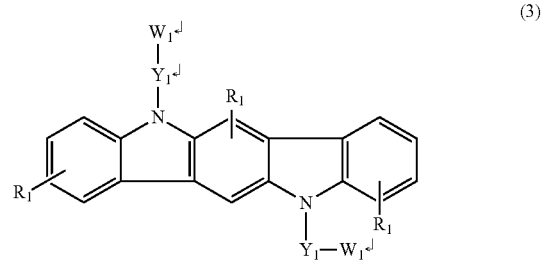

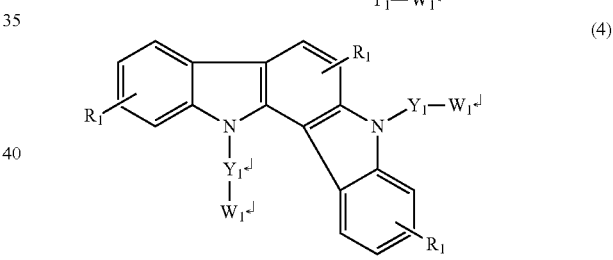

In the formula (3) or (4), $Y_1$'s and $W_1$'s each have the same meaning as that in the general formula (1), and $R_1$'s each have the same meaning as that of each of R's in the general formula (1).

Z in the general formula (2) preferably has at least one group represented by the following formula (9), (10), or (11) therein.

In the formula (9), $Ar_1$ and $Ar_2$ each independently represent a $C_6$ to $C_{30}$ aryl group or a $C_3$ to $C_{30}$ heteroaryl group, and $Ar_1$, $Ar_2$, and N may form a condensed ring, provided that none of $Ar_1$ and $Ar_2$ has a condensed ring structure formed of five or more rings.

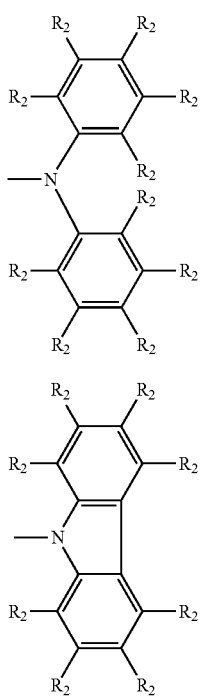

In the formulae (10) and (11), $R_2$'s each represent a hydrogen atom, a $C_1$ to $C_{20}$ alkyl group, a $C_1$ to $C_{20}$ alkoxy group, a $C_6$ to $C_{30}$ aryl group, a $C_6$ to $C_{30}$ aryloxy group, a $C_7$ to $C_{36}$ arylalkyl group, a $C_7$ to $C_{36}$ arylalkyloxy group, a $C_3$ to $C_{30}$ heteroaryl group, a $C_3$ to $C_{30}$ heteroaryloxy group, a $C_4$ to $C_{36}$ heteroarylalkyl group, a $C_4$ to $C_{36}$ heteroarylalkyloxy group, or a $C_3$ to $C_{30}$ cycloalkyl group, and may be identical to or different from one another, provided that none of $R_2$'s has a condensed ring structure formed of five or more rings.

It is preferred that the polymerizable groups $W_1$'s and $W_2$ in the general formulae (1), (1a), and (2) be each a radically polymerizable group or a cationically polymerizable group. In addition, it is preferred that the polymerizable groups $W_1$'s and $W_2$ be each independently at least one group selected from a vinyl group, a substituted vinyl group substituted with an alkyl group having 1 to 6 carbon atoms, an epoxy group, and an oxetanyl group.

It is preferred that: $W_1$'s and $W_2$ in the general formulae (1), (1a), and (2) each represent a vinyl group analogue selected from a vinyl group and a substituted vinyl group; the compound represented by the general formula (1) have two vinyl group analogues; and the compound represented by the general formula (2) have one vinyl group analogue.

In addition, the present invention relates to a cured product obtained by polymerizing and curing the curable composition. The curable composition may contain the compound represented by the general formula (1) alone, or may contain both the compound represented by the general formula (1) and the compound represented by the general formula (2). In addition, the cured product obtained by polymerizing and curing the curable composition may be a homopolymer of the compound represented by the general formula (1), or may be a copolymer of the compound represented by the general formula (1) and the compound represented by the general formula (2).

The present invention also relates to an organic electroluminescent element, including organic layers between an anode layer and a cathode layer laminated on a substrate, in which at least one of the organic layers contains the cured product. The organic layer containing the cured product is, for example, a hole transport layer.

DESCRIPTION OF EMBODIMENTS

Hereinafter, an embodiment of the present invention is described in detail.

A curable composition of the present invention and a cured product thereof each contain an indolocarbazole skeleton having two polymerizable groups capable of imparting an excellent charge transporting ability, in particular, an excellent hole transporting ability.

The curable composition of the present invention contains an indolocarbazole skeleton compound having two polymerizable groups represented by the general formula (1).

The indolocarbazole skeleton is produced by removing two H atoms at two N-positions from a condensed ring compound formed of five rings in which an indole ring and a carbazole ring are condensed. The skeleton has a plurality of positions where the indole ring and the carbazole ring can be condensed. Accordingly, when substituents at the two N-positions are different from each other, the groups of each of six kinds of structural isomers represented by the following formulae (A) to (F) can be adopted and any one of the structural isomers is permitted. It should be noted that when the substituents at the two N-positions are identical to each other, the structural isomers represented by the formulae (C) and (F) are of the same structure, and hence the number of kinds of the isomers becomes five. The indolocarbazole skeleton can have a substituent to such an extent that an effect of the present invention is not impaired.

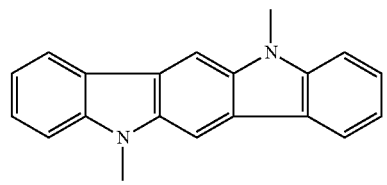

(A)

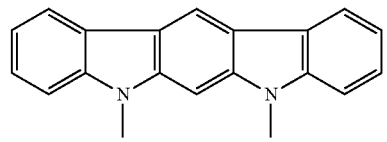

(B)

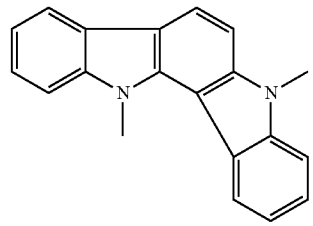

(C)

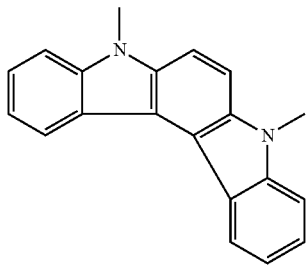

(D)

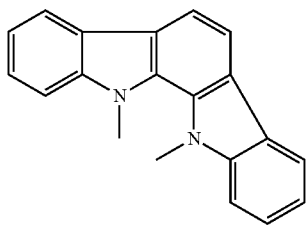

(E)

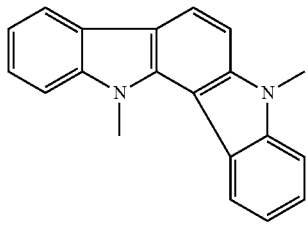

(F)

In the general formula (1), a ring A represents a heterocycle represented by the formula (1a), the heterocycle being condensed with an adjacent ring at an arbitrary position. However, the ring in the formula (1a) cannot be condensed at a side including N and hence any one of the structures represented by the formulae (A) to (F) is formed.

In the general formula (1), R's each represent a hydrogen atom, a $C_1$ to $C_{20}$ alkyl group, a $C_1$ to $C_{20}$ alkoxy group, a $C_6$ to $C_{30}$ aryl group, a $C_6$ to $C_{30}$ aryloxy group, a $C_7$ to $C_{36}$ arylalkyl group, a $C_7$ to $C_{36}$ arylalkyloxy group, a $C_3$ to $C_{30}$ heteroaryl group, a $C_3$ to $C_{30}$ heteroaryloxy group, a $C_4$ to $C_{36}$ heteroarylalkyl group, a $C_4$ to $C_{36}$ heteroarylalkyloxy group, or a $C_3$ to $C_{30}$ cycloalkyl group, and may be identical to or different from one another. It is preferred that R's each represent a hydrogen atom, a $C_1$ to $C_{20}$ alkyl group, a $C_1$ to $C_{20}$ alkoxy group, a $C_6$ to $C_{30}$ aryl group, a $C_3$ to $C_{30}$ heteroaryl group, or a $C_3$ to $C_{30}$ cycloalkyl group. It is more preferred that R's each represent a hydrogen atom, a $C_1$ to $C_8$ alkyl group, a $C_1$ to $C_8$ alkoxy group, a $C_6$ to $C_{18}$ aryl group, a $C_3$ to $C_{18}$ heteroaryl group, or a $C_3$ to $C_{12}$ cycloalkyl group. Each of those groups may further have a substituent to such an extent that the performance of the curable composition is not adversely affected, provided that none of R's has a condensed ring structure formed of five or more rings.

Specific examples of the alkyl group include a methyl group, an ethyl group, a propyl group, a butyl group, a pentyl group, a hexyl group, a heptyl group, an octyl group, a nonyl group, and a decyl group, and preferred specific examples thereof include alkyl groups each having 1 to 8 carbon atoms, such as a methyl group, an ethyl group, a propyl group, a butyl group, a pentyl group, a hexyl group, a heptyl group, and an octyl group. The alkyl chain may be linear or branched.

Specific examples of the alkoxy group include a methyloxy group, an ethyloxy group, a propyloxy group, a butyloxy group, pentyloxy group, a hexyloxy group, a heptyloxy group, an octyloxy group, a nonyloxy group, and a decyloxy group, and preferred specific examples thereof include alkyloxy groups each having 1 to 8 carbon atoms, such as a methyloxy group, an ethyloxy group, a propyloxy group, a butyloxy group, a pentyloxy group, a hexyloxy group, a heptyloxy group, and an octyloxy group. The alkyl chain may be linear or branched.

Specific examples of the aryl group and the heteroaryl group include groups each produced by removing hydrogen from benzene, pentalene, indene, naphthalene, azulene, heptalene, octalene, indacene, acenaphthylene, phenalene, phenanthrene, anthracene, trindene, fluoranthene, acephenanthrylene, aceanthrylene, triphenylene, pyrene, chrysene, tetraphene, tetracene, pleiadene, picene, perylene, pentaphene, pentacene, tetraphenylene, cholanthrylene, helicene, hexaphene, rubicene, coronene, trinaphthylene, heptaphene, pyranthrene, ovalene, corannulene, fulminene, anthanthrene, zethrene, terrylene, naphthacenonaphthacene, truxene, furan, benzofuran, isobenzofuran, xanthene, oxathrene, dibenzofuran, peri-xanthenoxanthene, thiophene, thioxanthene, thianthrene, phenoxathiin, thionaphthene, isothianaphtene, thiophthene, thiophanthrene, dibenzothiophene, pyrrole, pyrazole, tellurazole, selenazole, thiazole, isothiazole, oxazole, furazan, pyridine, pyrazine, pyrimidine, pyridazine, triazine, indolizine, indole, isoindole, indazole, purine, quinolizine, isoquinoline, carbazole, indolocarbazole, imidazole, naphthyridine, phthalazine, quinazoline, benzodiazepine, quinoxaline, cinnoline, quinoline, pteridine, phenanthridine, acridine, perimidine, phenanthroline, phenazine, carboline, phenotellurazine, phenoselenazine, phenothiazine, phenoxazine, anthyridine, thebenidine, quindoline, quinindoline, acrindoline, phthaloperine, triphenodithiazine, triphenodioxazine, phenanthrazine, anthrazine, benzothiazole, benzimidazole, benzoxazole, benzisoxazole, benzisothiazole, or an aromatic compound in which a plurality of these aromatic rings are linked.

It should be noted that in the case of the group formed from an aromatic compound in which a plurality of the aromatic rings are linked, the number of the aromatic rings to be linked is preferably 2 to 10, more preferably 2 to 7, and the aromatic rings to be linked may be identical to or different from each other. In that case, the position of a bonding hand is not limited and may be a ring at a terminal portion of linked aromatic rings or may be a ring at the central portion thereof. Herein, the term "aromatic ring" is a generic term for an aromatic hydrocarbon ring and an aromatic heterocycle. In addition, when the linked aromatic rings include at least one heterocycle, the linked aromatic rings are included in the category of a heteroaryl group.

Herein, monovalent groups each produced by removing hydrogen from an aromatic compound in which a plurality of aromatic rings are linked are represented by, for example, the following formulae.

(12)

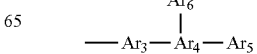

(13)

-continued

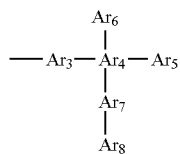
(14)

(In the formulae (12) to (14), $Ar_3$ to $Ar_8$ each represent a substituted or unsubstituted aromatic ring.)

Specific examples of the arylalkyl group and the heteroarylalkyl group include groups each obtained by linking the alkyl group to the aryl group or the heteroaryl group.

Specific examples of the aryloxy group, the arylalkyloxy group, the heteroaryloxy group, and the heteroarylalkyloxy group include groups each obtained by linking an oxy group to the aryl group, the arylalkyl group, the heteroaryl group, or the heteroarylalkyl group.

Specific examples of the cycloalkyl group include a cyclopropyl group, a cyclobutyl group, a cyclopentyl group, a cyclohexyl group, a cycloheptyl group, a cyclooctyl group, and a methylcyclohexyl group, and preferred specific examples thereof include a cyclopentyl group, a cyclohexyl group, and methylcyclohexyl group.

In the general formulae (1) and (2), $Y_1$'s and $Y_2$ each represent a single bond or a divalent group, and may be identical to or different from one another. The divalent group is, for example, a group represented by $—(Z^2)_m—(X)_n—(Z^3)_p—(X)_q—$ where $Z^2$ and $Z^3$ each represent an alkylene, arylene, or heteroarylene group, X represents O, COO, S, CONH, CO, or the like, and m, n, p, and q each represent a number of 0 to 3. It is preferred that $Z^2$ and $Z^3$ each represent a $C_1$ to $C_{20}$ alkylene group, a $C_6$ to $C_{30}$ arylene group, or a $C_3$ to $C_{30}$ heteroarylene group, and X represent CO, COO, or O. $Y_1$'s and $Y_2$ each preferably represent a single bond, a $C_1$ to $C_6$ alkylene group, a $C_6$ to $C_{12}$ arylene group, a $C_3$ to $C_{12}$ heteroarylene group, CO, COO, or O, provided that none of $Y_1$'s and $Y_2$ has a condensed ring structure formed of five or more rings.

Specific examples of the alkylene group include a methylene group, an ethylene group, a propylene group, a butylene group, a pentylene group, a hexylene group, a heptylene group, an octylene group, a nonylene group, and a decylene group, and preferred specific examples thereof include alkylene groups each having 1 to 8 carbon atoms, such as a methylene group, an ethylene group, a propylene group, a butylene group, a pentylene group, a hexylene group, a heptylene group, and an octylene group. The alkyl chain may be linear or branched.

Specific examples of the arylene group and the heteroarylene group include groups each produced by removing two hydrogen atoms from any one of the aromatic rings exemplified for the aryl group and heteroaryl group each represented by R, or an aromatic compound in which a plurality of these aromatic rings are linked.

In the general formulae (1) and (2), $W_1$'s and $W_2$ each represent a polymerizable group and the polymerizable group can be polymerized with light, heat, a catalyst, or the like. Preferred examples of the polymerizable group include a radically polymerizable group and a cationically polymerizable group. The radically polymerizable group is preferably a vinyl group or a substituted vinyl group substituted with an alkyl group having 1 to 6 carbon atoms, more preferably a vinyl group analogue selected from a vinyl group and a substituted vinyl group. A preferred vinyl group analogue is represented by $—CR^1=CR^2R^3$ where $R^1$, $R^2$, and $R^3$ each represent hydrogen, a $C_1$ to $C_6$ alkyl group, or a phenyl group, preferably hydrogen or a $C_1$ to $C_3$ alkyl group. The cationically polymerizable group is preferably a cyclic ether group such as an epoxy group or an oxetane group. Such cyclic ether group may have a substituent and the substituent is, for example, an alkyl group having 1 to 6 carbon atoms.

In the compound represented by the general formula (1), a compound represented by the formula (3) or (4) is exemplified as a preferred compound. $R_1$'s, $Y_1$'s, and $W_1$'s have the same meanings as those of R's, $Y_1$'s, and $W_1$'s in the general formula (1).

In addition, the curable composition of the present invention can further contain 0 to 95 mol % of a compound represented by the general formula (2) with respect to the total number of moles of the compound represented by the general formula (1) and the compound represented by the general formula (2) defined as 100. The compound represented by the general formula (2) is preferably incorporated at a content in the range of 0 to 70%, though the content is not particularly limited as long as the curable composition contains the compound represented by the general formula (1).

In the general formula (2), Z represents a $C_6$ to $C_{30}$ aryl group, a $C_3$ to $C_{30}$ heteroaryl group, or a $C_{12}$ to $C_{60}$ diarylamino group, preferably a $C_6$ to $C_{24}$ aryl group, a $C_3$ to $C_{24}$ heteroaryl group, or a $C_{12}$ to $C_{48}$ diarylamino group, more preferably a $C_3$ to $C_{18}$ heteroaryl group or a $C_{12}$ to $C_{36}$ diarylamino group.

In the general formula (2), $Y_2$ has the same meaning as that of each of $Y_1$'s in the general formula (1) and $W_2$ has the same meaning as that of each of $W_1$'s in the general formula (1). The compound represented by the general formula (2) has one polymerizable group.

The compound represented by the general formula (2) is preferably a charge transporting compound having a polymerizable group and Z preferably has at least one group represented by the formula (9) therein. In the formula (9), $Ar_1$ and $Ar_2$ each independently represent a $C_6$ to $C_{30}$ aryl group or a $C_3$ to $C_{30}$ heteroaryl group, the aryl group and the heteroaryl group being the same as the aryl group and heteroaryl group described for R's in the general formula (1), and $Ar_1$, $Ar_2$, and N may form a condensed ring, provided that none of $Ar_1$ and $Ar_2$ represents a condensed ring formed of five or more rings. Further, Z in the general formula (2) more preferably has at least one group represented by the formula (10) or (11) therein. In the formulae (10) and (11), $R_2$'s each have the same meaning as that of each of R's described for the general formula (1).

Specific examples of the indolocarbazole compound having two polymerizable groups represented by the general formula (1) are shown below. However, the compound is by no means limited thereto.

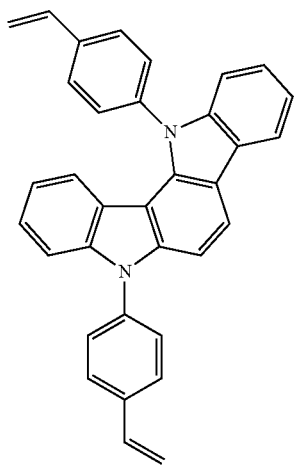
c-1
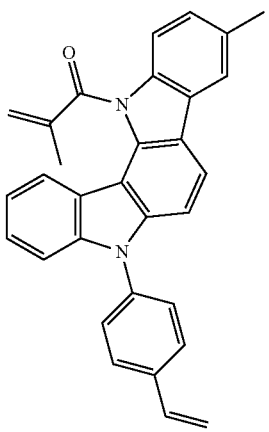
c-4
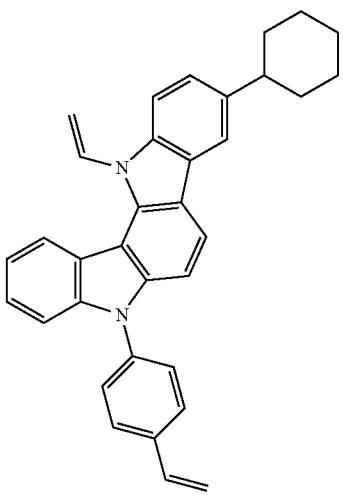
c-5
c-2
c-3
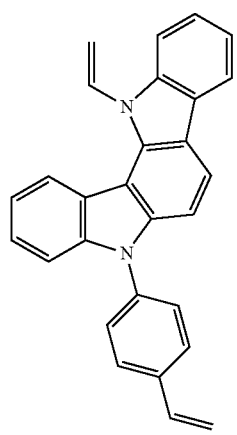
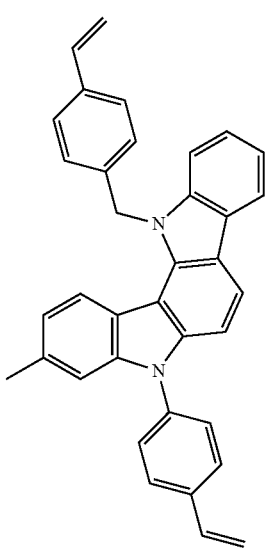
c-6

-continued
c-7
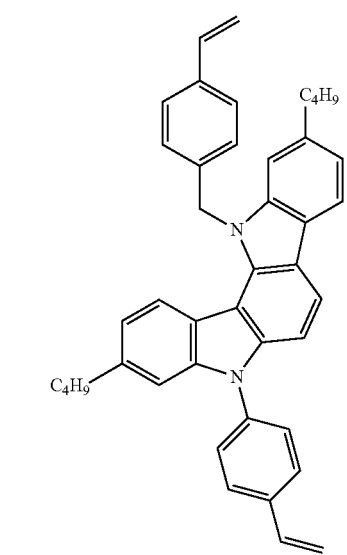
c-8
c-9
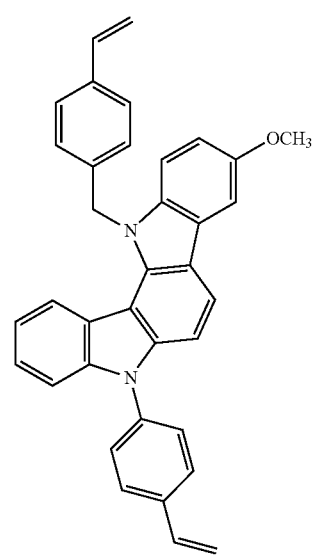
c-10
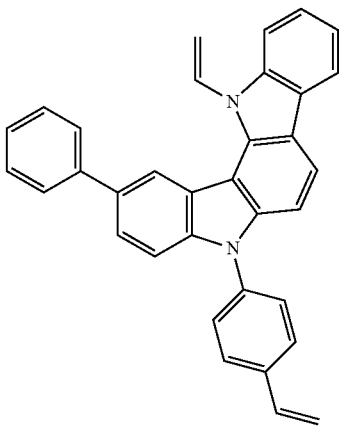
c-11
c-12
c-13

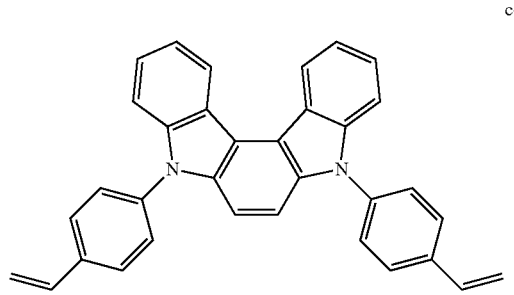
c-14
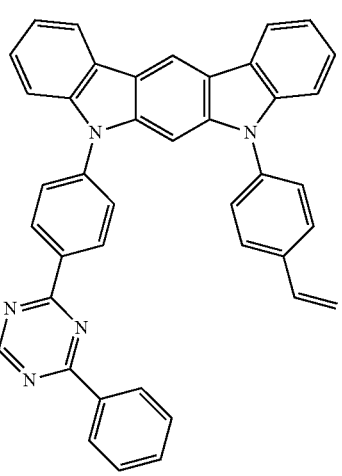
c-15
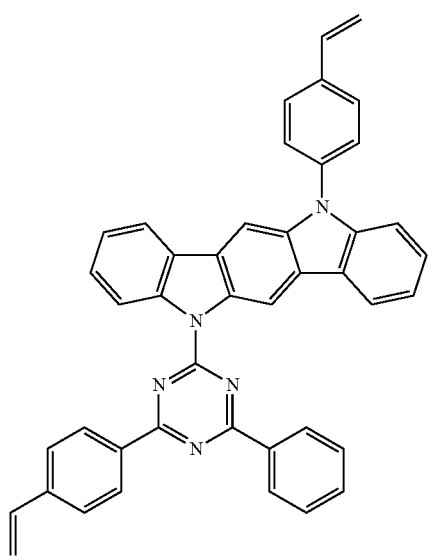
c-16
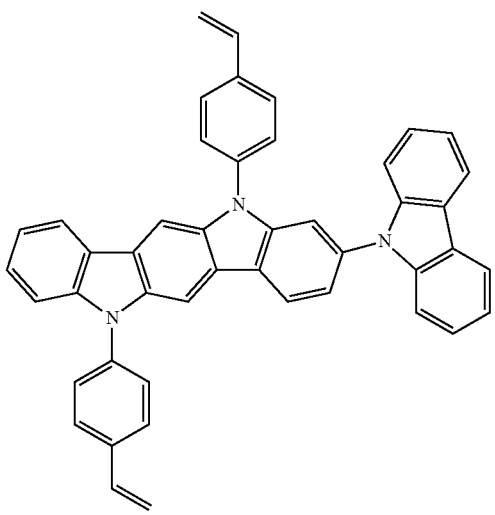
c-17
Next, specific examples of the compound having a polymerizable group represented by the general formula (2) are shown below. However, the compound is by no means limited thereto. In addition, one kind of the compounds shown here may be used alone, or two or more kinds thereof may be used as a mixture as required.
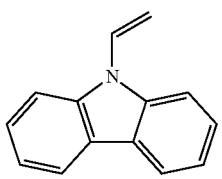
1
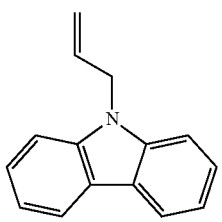
2
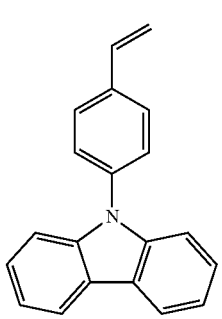
3

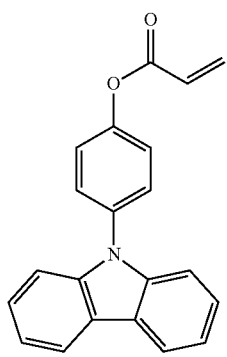
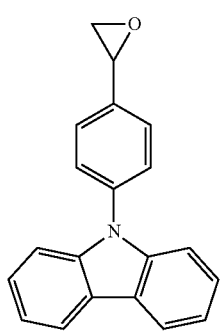
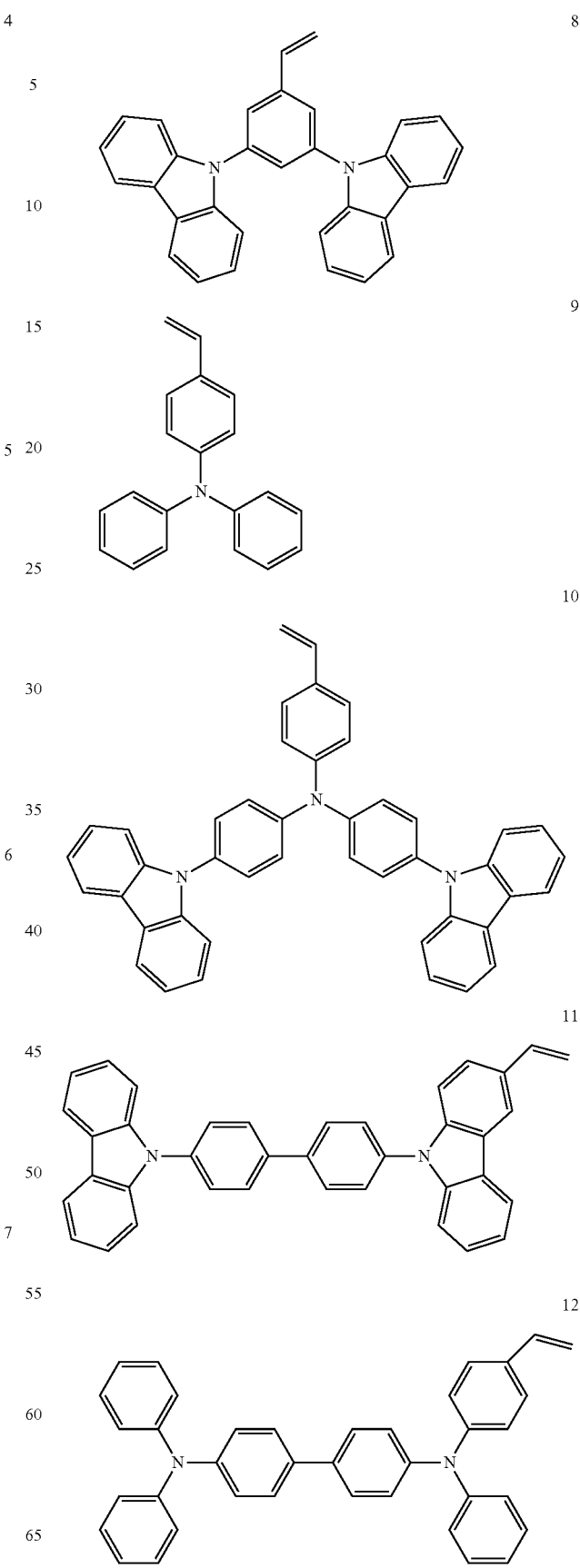

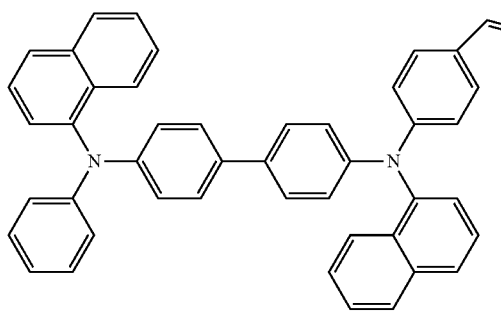

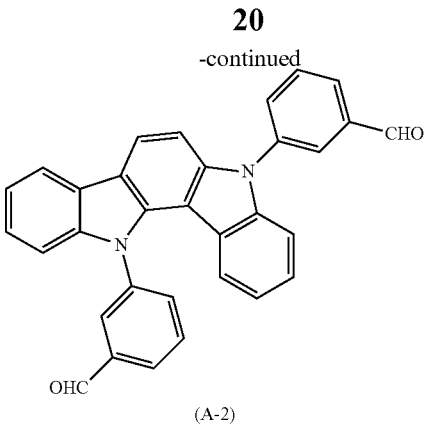

Each of the curable composition of the present invention and the cured product thereof, which may be formed only of the compound represented by the general formula (1), is preferably a mixture of the compound and the compound represented by the general formula (2) because the introduction of a second component can adjust the mobility of a carrier, a crosslinking density, and the like. Further, the curable composition is desirably formed by mixing a copolymerizable compound, a general organic solvent such as toluene or THF, and various polymerization catalysts such as AIBN, BPO, and phosphotungstic acid as required.

An approach to synthesizing each of the compounds represented by the general formulae (1) and (2), and an approach to curing the compound are exemplified below. However, the approaches are not limited to the following.

The compound having an indolocarbazole skeleton having two polymerizable groups represented by the general formula (1) of the present invention can be easily produced by a known method. For example, a compound having two vinyl groups can be produced by the following reaction formulae.

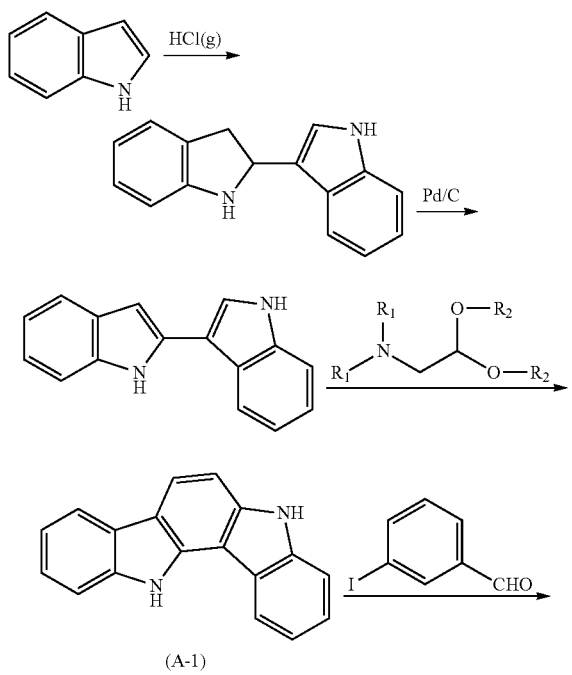

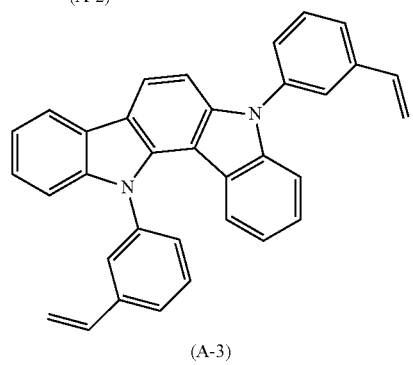

The compound having a polymerizable group represented by the general formula (2) of the present invention can be easily produced by a known method, though a vinyl compound such as commercially available diphenylaminostyrene or an acrylic compound such as phenyl acrylate may be used. For example, a compound having a vinyl group can be produced by the following reaction formula.

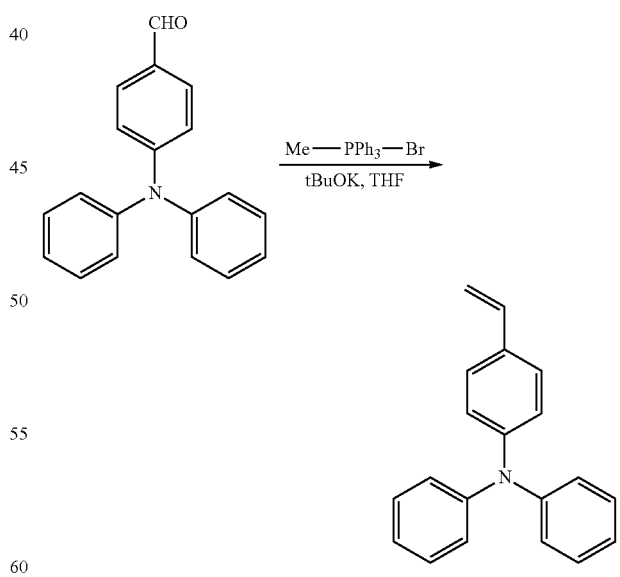

Although the curable composition of the present invention has only to contain the compound represented by the general formula (1) alone or a mixture of the compound and the compound represented by the general formula (2), the curable composition is desirably turned into a cured product by: melting the curable composition or dissolving the curable composition in a solvent; forming the melt or solution into a film according to an application method such as a spin coating method, an ink-jet method, a printing method, a spray coating method, or a dispenser method; and crosslinking and curing the film, which is in its natural state or from which the solvent has been removed by drying, with heat, light, a catalyst, or the like. The cured product can be easily produced by a known method. For example, a cured film having a crosslinked structure and insoluble in any solvent can be obtained by: forming poly(3,4-ethylenedioxythiophene)/polystyrene sulfonic acid (PEDOT/PSS) into a film on a glass substrate with ITO; dissolving the compound represented by the general formula (1) in an arbitrary solvent such as toluene, anisole, or THF; forming the solution into a film on the film according to the spin coating method; and then heating the substrate with a hot plate under an anaerobic condition.

In the case of a mixture of two or more kinds of compounds represented by the general formula (1) and the general formula (2) as well, the curing can be similarly performed under the same conditions as those in the case of the single compound by adjusting a temperature and a curing time, and by adding a catalyst corresponding to each polymerizable group as required. Further, in the case of the mixture of two or more kinds of compounds, when the polymerizable groups are made copolymerizable, copolymerization progresses well. In this case, it is advantageous to make the polymerizable groups identical to each other in kind.

An excellent organic electroluminescent element is obtained by incorporating any one of the curable composition of the present invention and the cured product thereof into an organic layer of the organic EL element. The curable composition or the cured product is preferably incorporated into at least one organic layer selected from a light emission layer, a hole transport layer, an electron transport layer, and a hole blocking element layer. The curable composition or the cured product is more preferably incorporated as a material for the hole transport layer.

Next, an organic electroluminescent element using the curable composition of the present invention and the cured product thereof is described.

The organic electroluminescent element using the curable composition of the present invention and the cured product thereof has a plurality of organic layers between a pair of an anode and a cathode. In particular, the element preferably includes the hole transport layer/light emission layer and electron transport layer, the hole transport layer and light emission layer/electron transport layer, or the hole transport layer/light emission layer/electron transport layer. The element particularly preferably has a layer structure including the hole transport layer/light emission layer/electron transport layer. In addition, the organic electroluminescent element of the present invention may be produced by forming the organic layers and providing protective layers on the respective layers. Further, a protective film may be provided to protect the whole of the element from moisture or oxygen.

The light emission layer is a layer containing a light emitting material, which may emit fluorescent light or phosphorescent light. In addition, the light emitting material may be used as a dopant, and a host material may be used in combination.

For the light emitting material in the light emission layer, any of the known compounds disclosed in various literatures and the following compounds may be used as a fluorescent light emitting material. However, the material is by no means limited thereto.

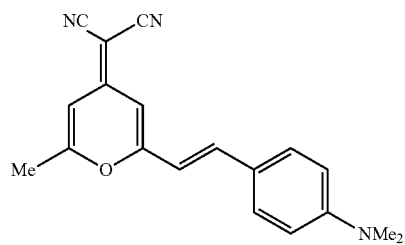

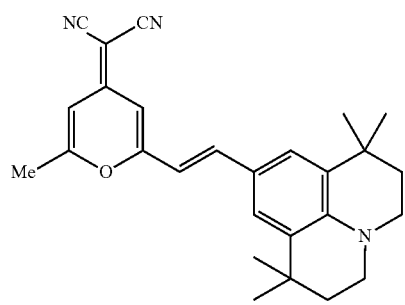

Meanwhile, a phosphorescent light emitting material is preferably a material containing an organic metal complex including at least one metal selected from ruthenium, rhodium, palladium, silver, rhenium, osmium, iridium, platinum, and gold. Such organic metal complex is known in the patent literatures and the like, and it is possible to use a complex selected therefrom.

Examples of the phosphorescent light emitting material for providing high light emission efficiency include complexes such as $Ir(ppy)_3$, complexes such as $Ir(bt)_2.acac_3$, and complexes such as $PtOEt_3$, the complexes each having a noble metal element such as Ir as a central metal. The phosphorescent light emitting material is specifically exemplified below, but is not limited thereto.

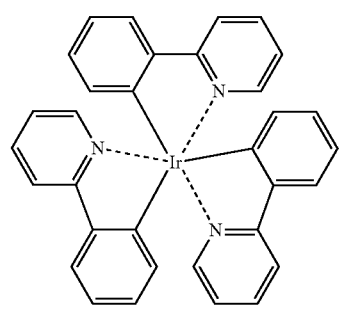

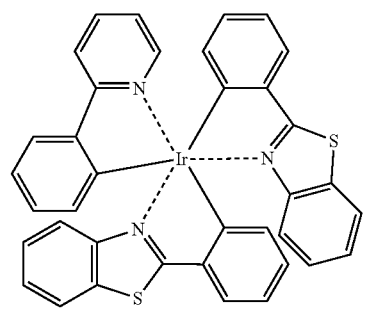

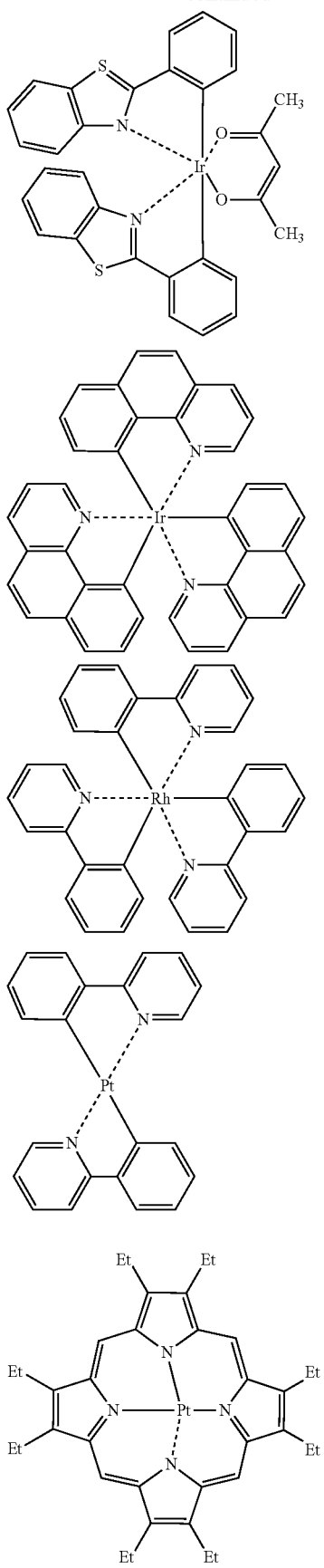

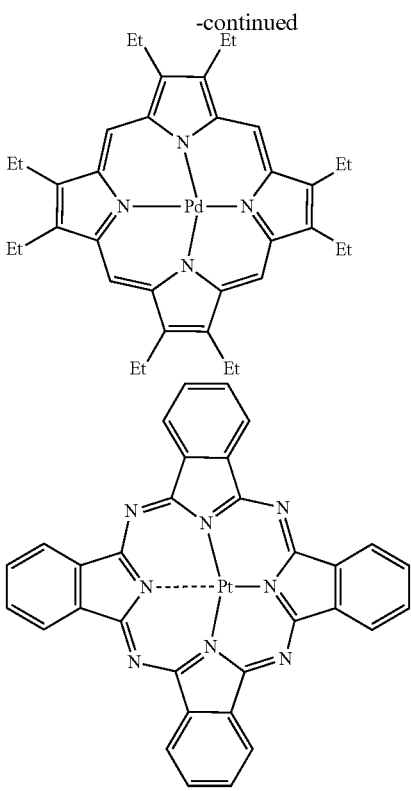

Organic electroluminescent elements having various emission wavelengths may be produced by using different kinds of light emitting materials.

In the case where the light emitting material is used as a dopant, the amount of the material in the light emission layer falls within the range of preferably 0.1 to 50 wt %, more preferably 1 to 30 wt %.

As the host material in the light emission layer, a known host material or the like may be used, and the polymer of the present invention may be used as the host material. In addition, the polymer of the present invention may be used in combination with any other host material.

The known host compound that may be used is preferably a compound that has a hole transporting ability or an electron transporting ability, is capable of preventing luminescence from having a longer wavelength, and has a higher glass transition temperature.

Such other host material is known through many patent literatures and the like, and hence the host material may be selected therefrom. Specific examples of the host material include, but not limited to, an indole derivative, a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidene-based compound, a porphyrin-based compound, an anthraquinodimethane derivative, an anthrone derivative, a diphenylquinone derivative, a thiopyran dioxide derivative, a heterocyclic tetracarboxylic acid anhydride such as naphthaleneperylene, a phthalocyanine derivative, various metal complexes typified by a metal complex of an 8-quinolinol derivative, a metal phthalocyanine, and metal complexes of benzoxazole and benzothiazole derivatives, and polymer compounds such as a polysilane-based compound, a poly(N-vinylcarbazole) derivative, an aniline-based polymer, a thiophene oligomer, a polythiophene derivative, a polyphenylene derivative, a polyphenylene vinylene derivative, and a polyfluorene derivative.

The curable composition of the present invention and the cured product thereof are each advantageously used as a hole transporting compound forming the hole transport layer. As required, the curable composition or the cured product may be used as a composition as follows to such an extent that an object of the present invention is not impaired: the curable composition or the cured product is blended with one or two or more kinds of, for example, low-molecular weight hole transporting compounds such as a triphenylamine derivative and carbazole derivative of a tertiary amine as additives. Specific examples of the hole transporting compound are shown below. However, the compound is not limited thereto.

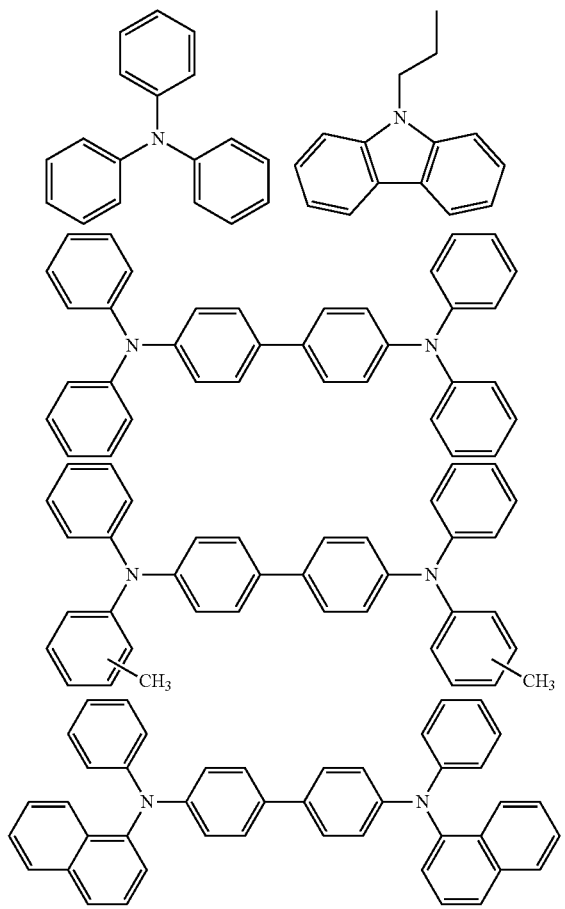

An electron transporting compound that forms the electron transport layer is exemplified by an oxadiazole derivative, an imidazole derivative, and a triazole derivative. As required, the curable composition or the cured product may be used as a composition as follows to such an extent that an object of the present invention is not impaired: the curable composition or the cured product is blended with one or two or more kinds of, for example, low-molecular weight electron transporting compounds as additives. Specific examples of the electron transporting compound are shown below. However, the compound is not limited thereto.

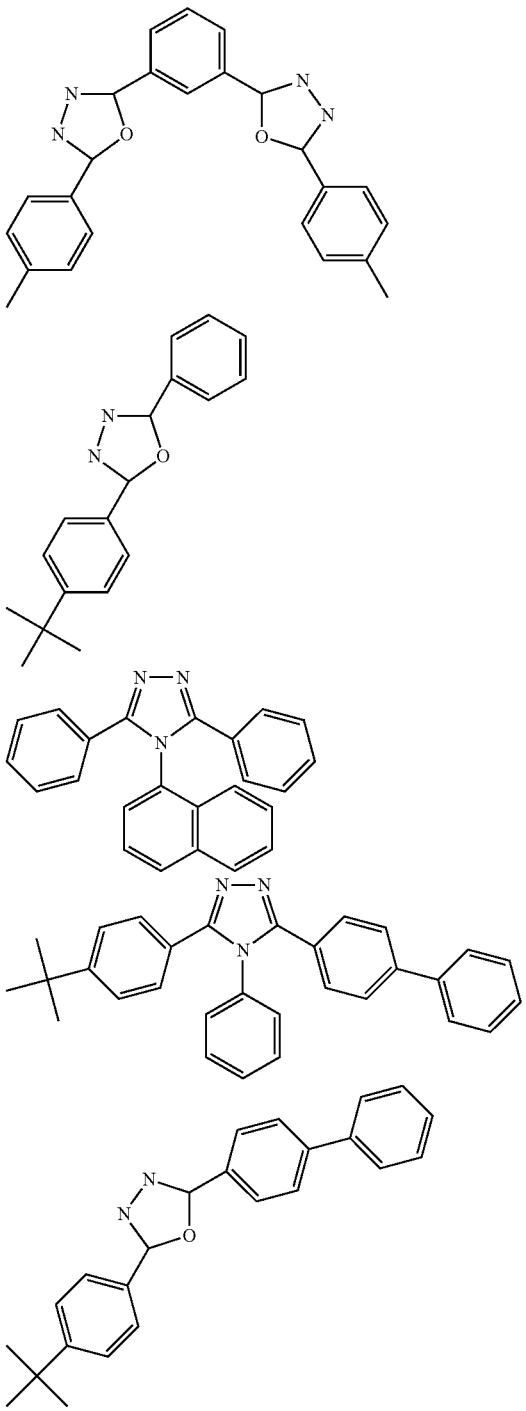

In addition, in order to improve efficiency of hole injection from the anode, a hole injection layer may be inserted between the anode and the hole transport layer or the light emission layer. As a hole injecting material that forms the hole injection layer, a conductive polymer such as a polythiophene derivative or a polypyrrole derivative may be used. Of those, a polythiophene derivative, poly(3,4-ethylenedioxythiophene)/polystyrene sulfonic acid (PEDOT/

PSS) is preferred in view of the efficiency of hole injection. In the case of using the hole injection layer, the thickness of the hole injection layer is preferably 200 nm or less, more preferably 100 nm or less.

The anode supplies holes to the hole injection layer, the hole transport layer, the light emission layer, or the like, and is generally formed on a glass substrate. The material for the anode used in the present invention is not particularly limited, and specific examples thereof include a conductive metal oxide such as indium-tin oxide (ITO) or tin oxide, and a metal such as gold, silver, or platinum. Further, a commercially available glass with ITO may be used. The commercially available glass with ITO is usually washed with a cleaner aqueous solution and a solvent, and cleaned by a UV ozone irradiation apparatus or a plasma irradiation apparatus before use.

The cathode supplies electrons to the electron transport layer or the light emission layer. The material for the anode used in the present invention is not particularly limited, and specific examples thereof include a metal such as Li, Mg, Ca, or Al, and an alloy thereof such as an Mg—Ag alloy or an Mg—Al alloy.

The cathode and anode can be formed by a known method, i.e., a vacuum deposition method or a sputtering method. The thickness of the cathode is preferably 300 nm or less, more preferably 200 nm or less, while the thickness of the anode is preferably 200 nm or less, more preferably 100 nm or less.

In general, a spin coating method is used as a method of forming a layer of a polymer such as a polymer light emitting material, a polymer material for the hole transport layer, or a polymer material for the electron transport layer. In addition, as a technology for forming a large-area organic polymer layer, there are given, for example, an ink-jet method, a printing method, a spray coating method, and a dispenser method, but the technology is by no means limited thereto.

EXAMPLES

Hereinafter, the present invention is specifically described by way of Examples. However, the present invention is not limited to Examples shown below.

Compounds synthesized in Synthesis Examples and Examples were identified by one or more kinds of analysis methods selected from $^1$H-NMR (solvent: deuterated chloroform), FD-MS, GPC, TGA, DSC, UV, and IR analyses.

Synthesis Example 1

Synthesis of Compound (A-3)

A compound (A-1) is prepared, and compounds (A-2) and (A-3) are synthesized in accordance with a scheme (S-1).

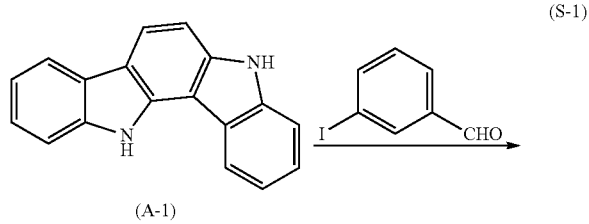

(S-1)

(A-1)

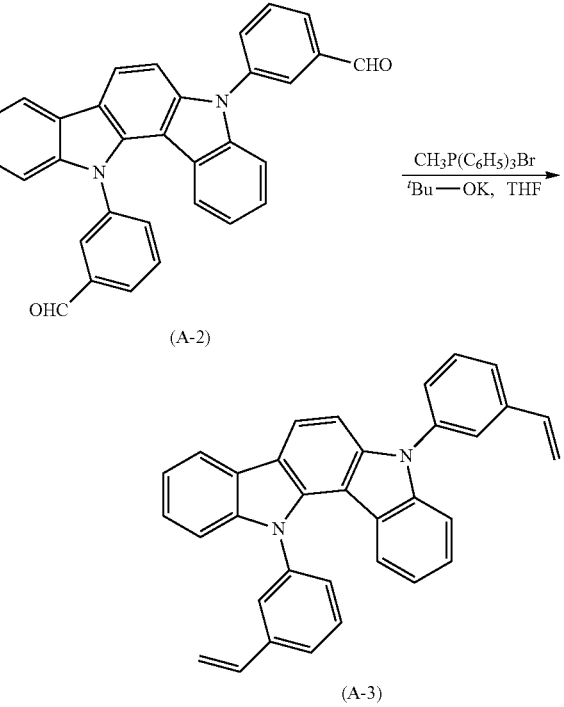

(A-2)

(A-3)

Under a nitrogen atmosphere, 5.00 g (19.4 mmol) of the compound (A-1) and 100 g of 1,3-dimethyl-2-imidazolidinone were added to a 1,000-ml flask, and then the mixture was stirred. Next, 17.97 g (77.6 mmol) of 3-iodobenzaldehyde, 1.38 g (9.7 mmol) of cuprous oxide, and 8.03 g (58.2 mmol) of potassium carbonate were added into the flask, and then the mixture was stirred at a bath temperature of 170° C. for 22 hr. To room temperature after cooling, the solid content was separated by filtration, and then ethyl acetate and a 2-mol/l hydrochloric acid were added to the filtrate to perform oil-water separation. The organic layer was dehydrated with anhydrous magnesium sulfate, followed by distillation under reduced pressure. After that, the residue was purified by silica gel column chromatography to provide 1.89 g (yield: 21%) of the compound (A-1) as white powder.

$^1$H-NMR (400 MHz, CDCl$_3$ r.t.): δ (ppm); 10.149 (1H, s), 10.113 (1H, s), 8.14-8.21 (5H, m), 8.065 (1H, dt, J=7, 2), 7.913 (1H, dt, J=8, 2), 7.908 (1H, dt, J=8, 2), 7.846 (2H, br t, J=8), 7.21-7.40 (6H, m), 6.790 (1H, ddd, J=2, 7, 8), 5.979 (1H, d, J=8)

FD-MS spectrum: 464 (M+, base)

Next, under a nitrogen atmosphere, 1.84 g (3.97 mmol) of the compound (A-2), 2.97 g (8.34 mmol) of methyltriphenylphosphonium bromide, and 380 ml of dehydrated tetrahydrofuran were added to a 500-ml flask, and then the mixture was stirred at room temperature. 9 ml of a solution of 0.98 g (8.73 mol) of potassium tert-butoxide in dehydrated tetrahydrofuran were dropped to the mixture over 5 minutes and then the whole was subjected to a reaction at room temperature for 2.5 hr. The resultant was transferred to a 2-L flask and then 50 ml of water were added into the flask. After tetrahydrofuran had been distilled off, ethyl acetate and a saturated NaCl solution were added to perform oil-water separation. The organic layer was dehydrated with anhydrous magnesium sulfate, followed by removed solvent under reduced pressure. The residue was purified by silica gel column chromatography twice to provide 0.73 g (yield: 40%) of the compound (A-3) as white powder.

$^1$H-NMR (400 MHz, CDCl$_3$, r.t.): δ (ppm); 8.172 (1H, d, J=9), 8.150 (1H, dd, J=8, 2), 7.69-7.72 (2H, m), 7.58-7.63 (3H, m), 7.554 (1H, dt, J=8, 2), 7.524 (1H, ddd, J=9, 2, 1), 7.472 (1H, dt, J=7, 2), 7.30-7.36 (3H, m), 7.313 (1H, d, J=8), 7.291 (1H, br d, J=8), 6.808 (1H, dd, J=18, 12), 6.804 (1H, dd, J=18, 11), 6.803 (1H, ddd, J=8, 7, 1), 6.060 (1H, d, J=8), 5.832 (1H, br d, J=18), 5.806 (1H, br d, J=18), 5.355 (1H, d, J=12), 5.326 (1H, d, J=11)

FD-MS spectrum: 464 (M+, base)

Example 2

A film of poly(3,4-ethylenedioxythiophene)/polystyrene sulfonic acid (PEDOT/PSS): (manufactured by H.C. Starck, product name: Clevios PCH8000) was formed to serve as a hole injection layer at a thickness of 25 nm on a glass substrate with ITO having a thickness of 150 nm, which had been washed with a solvent and treated by UV and ozone. Next, the compound (A-3) was dissolved in tetrahydrofuran to prepare a 0.4-wt % solution, and a film having a thickness of 20 nm was formed to serve as a hole transport layer by a spin coating method. Next, the solvent was removed with a hot plate under an anaerobic condition at 150° C. for 3 hr, followed by heating and curing. A film of a light emission layer having a thickness of 40 nm was formed by co-deposition using tris(2-(p-tolyl)pyridine)iridium(III) as a light emission layer dopant and using 4,4'-bis(9H-carbazol-9-yl)biphenyl as a light emission layer host by a vacuum deposition apparatus at a dopant concentration of 0.6 wt %. After that, a film of Alq$_3$ having a thickness of 35 nm and a film of LiF/Al having a thickness of 170 nm as a cathode were formed using the vacuum deposition apparatus. The element was encapsulated in a glove box. Thus, an organic electroluminescent element was produced.

An external power supply was connected to the organic electroluminescent element thus obtained and then a DC voltage was applied. As a result, the element was confirmed to have such light emission properties as shown in Table 1. A luminance shown in Table 1 is a value at 20 mA/cm$^2$. It should be noted that the maximum wavelength of the light emission spectrum of the element was 550 nm and green light emission derived from an iridium complex was observed.

Example 3

A film of poly(3,4-ethylenedioxythiophene)/polystyrene sulfonic acid (PEDOT/PSS): (manufactured by H.C. Starck, product name: Clevios PCH8000) was formed to serve as a hole injection layer at a thickness of 25 nm on a glass substrate with ITO having a thickness of 150 nm, which had been washed with a solvent and treated by UV and ozone. Next, the compound (A-3) was dissolved in tetrahydrofuran to prepare a 0.4-wt % solution and then the solution was formed into a film having a thickness of 20 nm by a spin coating method to serve as a hole transport layer. Next, the solvent was removed with a hot plate under an anaerobic condition at 150° C. for 1 hr, followed by heating and curing. The thermally cured film is a film having a crosslinked structure and is insoluble in any solvent. The thermally cured film is a hole transport layer (HTL). Then, tris(2-(p-tolyl)pyridine)iridium(III) was used as a light emission layer dopant and 4,4'-bis(9H-carbazol-9-yl)biphenyl was used as a light emission layer host, and a 1-wt % solution was prepared by dissolving the dopant and the host in toluene so that the concentration of the dopant became 0.6 wt %. The solution was formed into a film having a thickness of 40 nm by a spin coating method to serve as a light emission layer. After that, Alq$_3$ was formed into a film having a thickness of 35 nm to serve as an electron transport layer and LiF/Al was formed into a film having a thickness of 170 nm to serve as a cathode with a vacuum deposition apparatus, and then the element was encapsulated in a glove box. Thus, an organic electroluminescent element was produced. An element evaluation was performed in the same manner as in Example 2. It should be noted that the following was confirmed with a high-speed spectroscopic ellipsometer (M2000 manufactured by J.A. Woollam JAPAN Co., Inc.): after the production of the light emission layer by spin coating, the cured film did not dissolve and was able to be laminated on the light emission layer.

Example 4

An element was produced and evaluated in the same manner as in Example 3 except that a mixture obtained by mixing the compound (A-3) and diphenylaminostyrene (DPAS) at a ratio of 5:5 was used instead of the compound (A-3) alone in Example 3.

Example 5

An element was produced and evaluated in the same manner as in Example 3 except that the following compound (A-4) was used instead of the compound (A-3) in Example 3. It should be noted that the compound (A-4) was synthesized by employing the approach to producing the compound (A-2) from the compound (A-1) shown in the scheme (S-1).

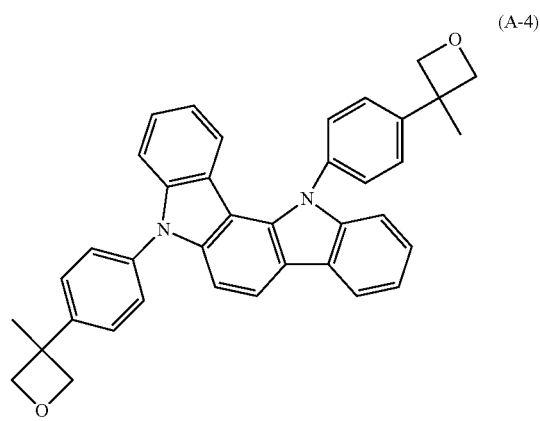 [SMILES: CC1(c2ccc(-n3c4ccccc4c4c3ccc3c5ccccc5n(-c5ccc(C6(C)COC6)cc5)c34)cc2)COC1]

(A-4)

Example 6

An element was produced and evaluated in the same manner as in Example 3 except that the following compound (A-5) was used in Example 3. It should be noted that the compound (A-5) was synthesized by employing the approach shown in the scheme (S-1).

(A-5)

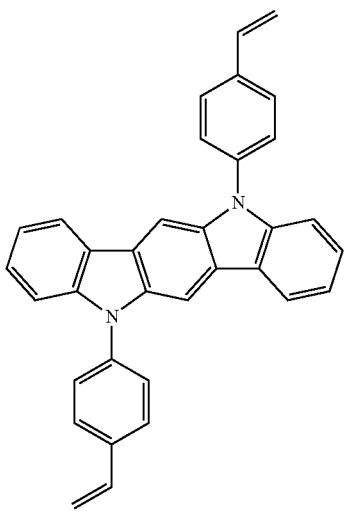

Comparative Example 1

An element was produced and evaluated in the same manner as in Example 2 except that the compound (A-3) was not used in Example 2.

Comparative Example 2

An element was produced and evaluated in the same manner as in Example 2 except the following: in Example 2, a hole transport layer was produced by using the following compound (B1) instead of the compound (A-3) and curing was performed by performing photopolymerization through the application of UV with a UV irradiation apparatus of an AC power supply system for 90 seconds.

(B1)

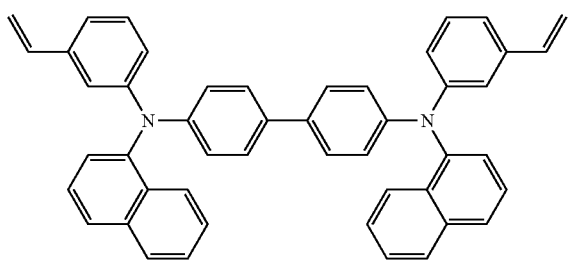

Comparative Example 3

An element was produced and evaluated in the same manner as in Example 3 except that the compound (A-3) was not used in Example 3.

Table 1 shows a compound used in a hole transport layer (HTL), a light emission layer production system, and the results of the element evaluations.

TABLE 1

| | HTL compound | Layer production system | Luminance (cd/m$^2$) | Voltage (V) |
|---|---|---|---|---|
| Example 2 | (A-3) | Dry | 5500 | 9.6 |
| 3 | (A-3) | Wet | 1600 | 9.7 |
| 4 | (A-3), (DPAS) | Wet | 1800 | 9.2 |
| 5 | (A-4) | Wet | 1300 | 9.5 |
| 6 | (A-5) | Wet | 1500 | 10.0 |
| Comparative Example 1 | None | Dry | 2300 | 7.9 |
| 2 | (B1) | Wet | 800 | 10.5 |
| 3 | None | Wet | 700 | 10.3 |

Example 2 and Comparative Example 1 show that an element having a hole transport layer formed by using the compound of the present invention through a wet process shows excellent element properties. In addition, Examples 3 to 6, and Comparative Examples 2 and 3 show that even when a hole transport layer is formed by using the compound of the present invention through the wet process and a light emission layer as an adjacent layer is further formed through the wet process, the layers can be suitably laminated and good light emission properties are expressed.

INDUSTRIAL APPLICABILITY

The use of the curable composition of the present invention and the cured product thereof in an organic layer of an organic electroluminescent element improves the hole injecting performance, electron resistance, and charge transporting performance of the element, and makes the element excellent in light emission efficiency. In addition, the use enables easy production of a large-area element because the use enables the lamination of an organic layer containing any other material as an upper layer by application. The organic electroluminescent element using the curable composition or the cured product is excellent in light emission efficiency. Accordingly, the element may be applied to an organic electroluminescent element to be used in, for example, a lighting device, an image display device, or back light for a display device, and hence its technical value is large.

The invention claimed is:

1. An organic electroluminescent element, comprising organic layers between an anode layer and a cathode layer laminated on a substrate, wherein at least one of the organic layers contains a cured product obtained by curing a curable composition containing 5 to 100 mol % of a compound represented by the general formula (1) and 0 to 95 mol % of a compound represented by the general formula (2) with respect to a total number of moles of the compound represented by the general formula) and the compound represented by the general formula (2) defined as 100:

33

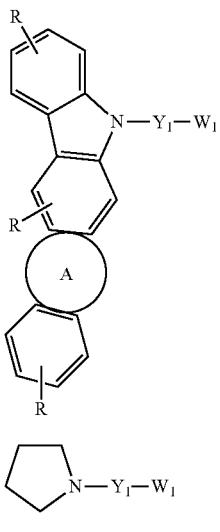

(1)

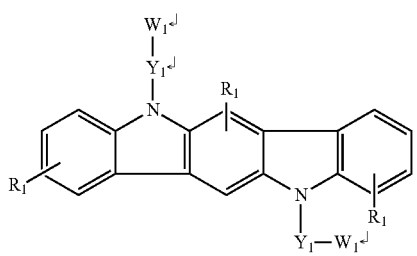

(1a)

Z—Y$_2$—W$_2$  (2)

in the formula (1), a ring A represents a heterocycle represented by the formula (1a), the heterocycle being condensed with an adjacent ring at an arbitrary position, R's each represent a hydrogen atom, a C$_1$ to C$_{20}$ alkyl group, a C$_1$ to C$_{20}$ alkoxy group, a C$_6$ to C$_{30}$ aryl group, a C$_6$ to C$_{30}$ aryloxy group, a C$_7$ to C$_{36}$ arylalkyl group, a C$_7$ to C$_{36}$ arylalkyloxy group, a C$_3$ to C$_{30}$ heteroaryl group, a C$_3$ to C$_{30}$ heteroaryloxy group, a C$_4$ to C$_{36}$ heteroarylalkyl group, a C$_4$ to C$_{36}$ heteroarylalkyloxy group, or a C$_3$ to C$_{30}$ cycloalkyl group, and may be identical to or different from one another, Y$_1$'s each represent a divalent group and may be identical to or different from each other, and W$_1$'s each independently represent a radically polymerizable group or a cationically polymerizable group selected from the group consisting of a vinyl group, a substituted vinyl group substituted with an alkyl group having 1 to 6 carbon atoms, an epoxy group, and an oxetanyl group, and may be identical to or different from each other; and in the formula (2), Z represents a C$_6$ to C$_{30}$ aryl group, a C$_3$ to C$_{30}$ heteroaryl group, or a C$_{12}$ to C$_{60}$ diarylamino group, Y$_2$ represents a divalent group, and W$_2$ independently represents a radically polymerizable group or a cationically polymerizable group selected from the group consisting of a vinyl group, a substituted vinyl group substituted with an alkyl group having 1 to 6 carbon atoms, an epoxy group, and an oxetanyl group.

2. An organic electroluminescent element according to claim 1, wherein the compound represented by the general formula (1) comprises a compound represented by the following formula (3) or (4):

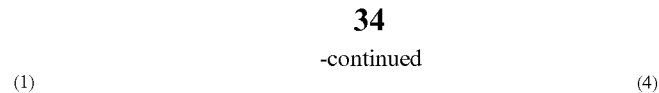

(3)

34

-continued

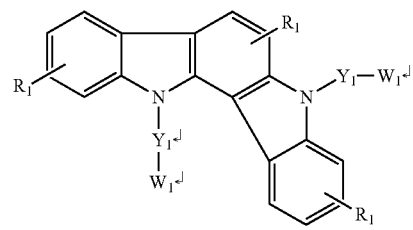

(4)

in the formula (3) or (4), Y$_1$'s and W$_1$'s each have the same meaning as that in the general formula (1), and R$_1$'s each have the same meaning as that of each of R's in the general formula (1).

3. An organic electroluminescent element according to claim 1, wherein Z in the general formula (2) has at least one group represented by the following formula (9) therein:

(9)

in the formula (9), Ar$_1$ and Ar$_2$ each independently represent a C$_6$ to C$_{30}$ aryl group or a C$_3$ to C$_{30}$ heteroaryl group, and Ar$_1$, Ar$_2$, and N may form a condensed ring.

4. An organic electroluminescent element according to claim 1, wherein Z in the general formula (2) has at least one group represented by the following formula (10) or (11) therein:

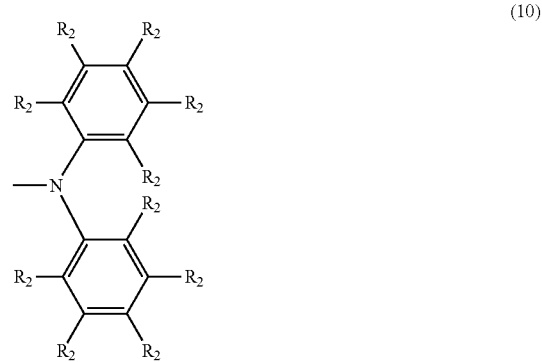

(10)

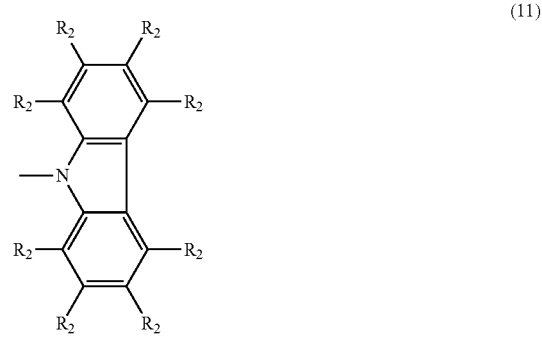

(11)

in the formulae (10) and (11), R$_2$'s each represent a hydrogen atom, a C$_1$ to C$_{20}$ alkyl group, a C$_1$ to C$_{20}$ alkoxy group, a C$_6$ to C$_{30}$ aryl group, a C$_6$ to C$_{30}$ aryloxy group, a $C_7$ to $C_{36}$ arylalkyl group, a $C_7$ to $C_{36}$ arylalkyloxy group, a $C_3$ to $C_{30}$ heteroaryl group, a $C_3$ to $C_{30}$ heteroaryloxy group, a $C_4$ to $C_{36}$ heteroarylalkyl group, a $C_4$ to $C_{36}$ heteroarylalkyloxy group, or a $C_3$ to $C_{30}$ cycloalkyl group, and may be identical to or different from one another.

5. An organic electroluminescent element according to claim 1, wherein:
$W_1$'s and $W_2$ in the general formulae (1), (1a), and (2) each represent a vinyl group analogue selected from a vinyl group and a substituted vinyl group;
the compound represented by the general formula (1) has two vinyl group analogues; and
the compound represented by the general formula (2) has one vinyl group analogue.

6. An organic electroluminescent element according to claim 1, wherein the cured product is obtained by curing a curable composition containing 100 mol % of the compound represented by the general formula (1).

7. An organic electroluminescent element according to claim 1, wherein the organic layer containing the cured product comprises a hole transport layer.

\* \* \* \* \*